(12) United States Patent
Iwamoto et al.

(10) Patent No.: US 11,463,068 B2
(45) Date of Patent: Oct. 4, 2022

(54) ACOUSTIC WAVE DEVICE, HIGH FREQUENCY FRONT END CIRCUIT, AND COMMUNICATION APPARATUS

(71) Applicant: Murata Manufacturing Co., Ltd., Nagaokakyo (JP)

(72) Inventors: Hideki Iwamoto, Nagaokakyo (JP); Tsutomu Takai, Nagaokakyo (JP); Ryo Nakagawa, Nagaokakyo (JP); Takashi Yamane, Nagaokakyo (JP); Masanori Otagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 606 days.

(21) Appl. No.: 16/562,506

(22) Filed: Sep. 6, 2019

(65) Prior Publication Data
US 2019/0393858 A1 Dec. 26, 2019

Related U.S. Application Data

(63) Continuation of application No. PCT/JP2018/006419, filed on Feb. 22, 2018.

(30) Foreign Application Priority Data

Mar. 9, 2017 (JP) .............................. JP2017-044691

(51) Int. Cl.
*H03H 9/02* (2006.01)
*H03H 9/25* (2006.01)
(Continued)

(52) U.S. Cl.
CPC .... *H03H 9/02866* (2013.01); *H03H 9/02559* (2013.01); *H03H 9/02834* (2013.01);
(Continued)

(58) Field of Classification Search
CPC .............. H03H 9/02; H03H 9/25; H03H 9/64
See application file for complete search history.

(56) References Cited

U.S. PATENT DOCUMENTS

| | | |
|---|---|---|
| 5,998,907 A | 12/1999 | Taguchi et al. |
| 9,484,885 B2 * | 11/2016 | Watanabe .............. H01L 41/047 |

(Continued)

FOREIGN PATENT DOCUMENTS

| | | |
|---|---|---|
| JP | 11-55070 A | 2/1999 |
| JP | 2003-229741 A | 8/2003 |

(Continued)

OTHER PUBLICATIONS

Blachowicz, "Study of the elastic properties of the lithium tantalate crystal by the Brillouin laser light scattering", 2000, Archives of acoustics, 25, 1, 23-34 (Year: 2000).*

(Continued)

*Primary Examiner* — Samuel S Outten
*Assistant Examiner* — Alan Wong
(74) *Attorney, Agent, or Firm* — Keating & Bennett, LLP

(57) ABSTRACT

An acoustic wave device includes a material layer with Euler angles and an elastic constant at the Euler angles represented by Expression 1, a piezoelectric body including opposing first and second principal surfaces, is laminated directly or indirectly on the material layer and has Euler angles, and whose elastic constant at the Euler angles is represented by the Expression 1 below, and an IDT electrode on at least one of first and second principal surfaces of the piezoelectric body, and in which a wave length determined by an electrode finger pitch is $\lambda$. A product of $C_{56}$ and $C_{56}$ (Continued)

has a positive value, and an absolute value of $C_{56}$ of the material layer is greater than an absolute value of $C_{56}$ of the piezoelectric body $$\begin{pmatrix} C_{11} & C_{12} & C_{13} & C_{14} & C_{15} & C_{16} \\ C_{21} & C_{22} & C_{23} & C_{24} & C_{25} & C_{26} \\ C_{31} & C_{32} & C_{33} & C_{34} & C_{35} & C_{36} \\ C_{41} & C_{42} & C_{43} & C_{44} & C_{45} & C_{46} \\ C_{51} & C_{52} & C_{53} & C_{54} & C_{55} & C_{56} \\ C_{61} & C_{62} & C_{63} & C_{64} & C_{65} & C_{66} \end{pmatrix}.$$ Expression 1

19 Claims, 7 Drawing Sheets

(51) Int. Cl.
  *H03H 9/145*  (2006.01)
  *H04B 1/00*  (2006.01)
(52) U.S. Cl.
  CPC .............. *H03H 9/145* (2013.01); *H03H 9/25* (2013.01); *H04B 1/0057* (2013.01)

(56) References Cited

U.S. PATENT DOCUMENTS

| | | | |
|---|---|---|---|
| 10,062,830 B2 * | 8/2018 | Nakagawa | H03H 9/25 |
| 11,063,202 B2 * | 7/2021 | Kimura | H01L 41/183 |
| 11,258,427 B2 * | 2/2022 | Kadota | H03H 9/145 |
| 2010/0182101 A1 | 7/2010 | Suzuki | |
| 2014/0225684 A1 | 8/2014 | Kando et al. | |
| 2018/0152170 A1 | 5/2018 | Iwamoto | |
| 2019/0393856 A1 * | 12/2019 | Iwamoto | H03H 9/02921 |

FOREIGN PATENT DOCUMENTS

| | | |
|---|---|---|
| JP | 2005-037153 A | 2/2005 |
| JP | 2005-347295 A | 12/2005 |
| JP | 2010-187373 A | 8/2010 |
| WO | 2013/061926 A1 | 5/2013 |
| WO | 2017/043394 A1 | 3/2017 |
| WO | 2017/209131 A1 | 12/2017 |

OTHER PUBLICATIONS

Hossain, "First-principles study on the structural, elastic, electronic and optical properties of LiNbO3", 2019, Heliyon 5 (2019) e01436 (Year: 2019).*
Official Communication issued in International Patent Application No. PCT/JP2018/006419, dated May 15, 2018.

* cited by examiner

ACOUSTIC WAVE DEVICE, HIGH FREQUENCY FRONT END CIRCUIT, AND COMMUNICATION APPARATUS

CROSS REFERENCE TO RELATED APPLICATIONS

This application claims the benefit of priority to Japanese Patent Application No. 2017-044691 filed on Mar. 9, 2017 and is a Continuation Application of PCT Application No. PCT/JP2018/006419 filed on Feb. 22, 2018. The entire contents of each application are hereby incorporated herein by reference.

BACKGROUND OF THE INVENTION

1. Field of the Invention

The present invention relates to an acoustic wave device.

2. Description of the Related Art

Various types of acoustic wave devices have been proposed in which a piezoelectric body is laminated directly or indirectly on a support substrate made of silicon. For example, in acoustic wave devices described in Japanese Unexamined Patent Application Publication No. 11-55070 and Japanese Unexamined Patent Application Publication No. 2005-347295, a piezoelectric body made of $LiTaO_3$ is laminated on a silicon substrate with an $SiO_2$ film interposed therebetween. In an acoustic wave device described in Japanese Unexamined Patent Application Publication No. 2010-187373, a piezoelectric body made of $LiTaO_3$ is laminated on a (111) plane, (100) plane, or (110) plane of silicon with an $SiO_2$ film interposed therebetween.

In Japanese Unexamined Patent Application Publication No. 2010-187373, it is stated that the heat resistance is able to be enhanced by using the (111) plane.

In the existing acoustic wave devices as described in Japanese Unexamined Patent Application Publication No. 11-55070, Japanese Unexamined Patent Application Publication No. 2005-347295, and Japanese Unexamined Patent Application Publication No. 2010-187373, energy of the main mode as an acoustic wave to be used is able to be concentrated in the piezoelectric body. However, it has been found that not only the main mode but also a high-order mode positioned on a higher frequency side relative to the main mode may be confined in the piezoelectric body at the same time. Due to this, the high-order mode is a spurious emission, thus raising a problem in that the characteristics of the acoustic wave device are deteriorated.

SUMMARY OF THE INVENTION

Preferred embodiments of the present invention provide acoustic wave devices that are each able to reduce or prevent a high-order mode while maintaining preferred characteristics of the main mode.

An acoustic wave device according to a preferred embodiment of the present invention includes a material layer which has Euler angles $(\varphi_1, \theta_1, \psi_1)$ and whose elastic constant at the Euler angles $(\varphi_1, \theta_1, \psi_1)$ is represented by Expression (1) provided below, a piezoelectric body which includes first and second principal surfaces opposing each other, is laminated directly or indirectly on the material layer so that the second principal surface is on the material layer side and has Euler angles $(\varphi_2, \theta_2, \psi_2)$, and whose elastic constant at the Euler angles $(\varphi_2, \theta_2, \psi_2)$ is represented by the Expression (1), and an interdigital transducer (IDT) electrode which is disposed on one of the first principal surface and the second principal surface of the piezoelectric body, and in which a wave length determined by an electrode finger pitch is $\lambda$. A product of $C_{56}$ of the piezoelectric body and $C_{56}$ of the material layer has a positive value, and an absolute value of $C_{56}$ of the material layer is greater than an absolute value of $C_{56}$ of the piezoelectric body.

Formula 1

$$\begin{pmatrix} C_{11} & C_{12} & C_{13} & C_{14} & C_{15} & C_{16} \\ C_{21} & C_{22} & C_{23} & C_{24} & C_{25} & C_{26} \\ C_{31} & C_{32} & C_{33} & C_{34} & C_{35} & C_{36} \\ C_{41} & C_{42} & C_{43} & C_{44} & C_{45} & C_{46} \\ C_{51} & C_{52} & C_{53} & C_{54} & C_{55} & C_{56} \\ C_{61} & C_{62} & C_{63} & C_{64} & C_{65} & C_{66} \end{pmatrix} \quad \text{Expression 1}$$

In an acoustic wave device according to a preferred embodiment of the present invention, an elastic constant $C_{ab}$ in the above Expression 1 is derived by an equation of $(C_{ab}) = [\alpha]^{-1} [C_{ab}^0][\beta]$. Here, $\alpha$ and $\beta$ are as follows.

Formula 2

$$\alpha =$$

$$\begin{pmatrix} l_1^2 & l_2^2 & l_3^2 & 2l_2l_3 & 2l_3l_1 & 2l_1l_2 \\ m_1^2 & m_2^2 & m_3^2 & 2m_2m_3 & 2m_3m_1 & 2m_1m_2 \\ n_1^2 & n_2^2 & n_3^2 & 2n_2n_3 & 2n_3n_1 & 2n_1n_2 \\ m_1n_1 & m_2n_2 & m_3n_3 & m_2n_3+m_3n_2 & m_3n_1+m_1n_3 & m_1n_2+m_2n_1 \\ n_1l_1 & n_2l_2 & n_3l_3 & n_2l_3+n_3l_2 & n_3l_1+n_1l_3 & n_1l_2+n_2l_1 \\ l_1m_1 & l_2m_2 & l_3m_3 & l_2m_3+l_3m_2 & l_3m_1+l_1m_3 & l_1m_2+l_2m_1 \end{pmatrix}$$

$$\beta =$$

$$\begin{pmatrix} l_1^2 & l_2^2 & l_3^2 & l_2l_3 & l_3l_1 & l_1l_2 \\ m_1^2 & m_2^2 & m_3^2 & m_2m_3 & m_3m_1 & m_1m_2 \\ n_1^2 & n_2^2 & n_3^2 & n_2n_3 & n_3n_1 & n_1n_2 \\ 2m_1n_1 & 2m_2n_2 & 2m_3n_3 & m_2n_3+m_3n_2 & m_3n_1+m_1n_3 & m_1n_2+m_2n_1 \\ 2n_1l_1 & 2n_2l_2 & 2n_3l_3 & n_2l_3+n_3l_2 & n_3l_1+n_1l_3 & n_1l_2+n_2l_1 \\ 2l_1m_1 & 2l_2m_2 & 2l_3m_3 & l_2m_3+l_3m_2 & l_3m_1+l_1m_3 & l_1m_2+l_2m_1 \end{pmatrix}$$

Note that, $l_1$ to $l_3$, $m_1$ to $m_3$, and $n_1$ to $n_3$ in $\alpha$ and $\beta$ are as follows.

$l_1 = \cos\psi \cos\varphi - \cos\theta \sin\varphi \sin\psi$
$l_2 = -\sin\psi \cos\varphi - \cos\theta \sin\varphi \cos\psi$
$l_3 = \sin\theta \sin\varphi$
$m_1 = \cos\psi \sin\varphi + \cos\theta \cos\varphi \sin\psi$
$m_2 = -\sin\psi \sin\varphi + \cos\theta \cos\varphi \cos\psi$
$m_3 = -\sin\theta \cos\varphi$
$n_1 = \sin\psi \sin\theta$
$n_2 = \cos\psi \sin\theta$
$n_3 = \cos\theta$ In an acoustic wave device according to a preferred embodiment of the present invention, at least a portion of a high-order mode excited by the IDT electrode propagates through both of the material layer and the piezoelectric body.

In an acoustic wave device according to a preferred embodiment of the present invention, the material layer is made of a high acoustic velocity material in which a bulk wave propagates at a higher acoustic velocity than an acoustic velocity of an acoustic wave propagating in the piezoelectric body.

In an acoustic wave device according to a preferred embodiment of the present invention, the piezoelectric body has a thickness of equal to or smaller than about 10λ. In this case, a response of the high-order mode is able to be more effectively reduced or prevented.

In an acoustic wave device according to a preferred embodiment of the present invention, an absolute value of $C_{56}$ of the material layer is equal to or greater than about 8.4 GPa. In this case, the high-order mode is able to be more effectively reduced or prevented.

In an acoustic wave device according to a preferred embodiment of the present invention, the absolute value of $C_{56}$ of the material layer is equal to or smaller than about 28 GPa. In this case, the deterioration in characteristics is unlikely to occur by the main mode in use.

In an acoustic wave device according to a preferred embodiment of the present invention, the material layer is made of a single crystal. Preferably, the single crystal of the material layer is made of a single crystal other than a piezoelectric body. In this case, an additional high-order mode is unlikely to be generated in the material layer. The main mode is able to be confined by the material layer, and outstanding characteristics are able to be obtained.

In an acoustic wave device according to a preferred embodiment of the present invention, the piezoelectric body has a thickness of equal to or smaller than about 3.5λ.

An acoustic wave device according to a preferred embodiment of the present invention further includes a low acoustic velocity film which is disposed between the material layer and the piezoelectric body, and in which a bulk wave propagates at a lower acoustic velocity than the acoustic velocity of the acoustic wave propagating in the piezoelectric body. Preferably, the low acoustic velocity film is a silicon oxide film. In this case, it is possible to improve frequency-temperature characteristics.

In an acoustic wave device according to a preferred embodiment of the present invention, the low acoustic velocity film has a thickness of equal to or smaller than about 2λ.

More preferably, the single crystal of the material layer is made of silicon. In this case, the high-order mode is able to be reduced or prevented even more effectively.

In an acoustic wave device according to a preferred embodiment of the present invention, the piezoelectric body is made of lithium tantalate. In this case, the high-order mode is able to be reduced or prevented, and an electromechanical coupling coefficient is able to be easily adjusted by adjusting a crystal orientation.

An acoustic wave device according to a preferred embodiment of the present invention further includes a high acoustic velocity film which is laminated between the low acoustic velocity film and the material layer, and in which a bulk wave propagates at a higher acoustic velocity than the acoustic velocity of the acoustic wave propagating in the piezoelectric body. In this case, it is possible to effectively reduce or prevent the high-order mode.

In an acoustic wave device according to a preferred embodiment of the present invention, the material layer is a support substrate.

In an acoustic wave device according to a preferred embodiment of the present invention, the material layer is a support substrate made of a high acoustic velocity material in which a bulk wave propagates at a higher acoustic velocity than the acoustic velocity of the acoustic wave propagating in the piezoelectric body.

An acoustic wave device according to a preferred embodiment of the present invention further includes a support substrate laminated on a principal surface of the material layer opposed to a principal surface of the material layer on which the piezoelectric body is laminated.

With the acoustic wave devices according to preferred embodiments of the present invention, it is possible to effectively reduce or prevent a response of a high-order mode positioned on a higher frequency side relative to the main mode while maintaining the characteristics of the main mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be in detail with reference to the accompanying drawings.

It should be noted that the preferred embodiments described herein are illustrative and that a partial substitution or combination of configurations between different preferred embodiments may be possible.

First Preferred Embodiment

Figure 1:
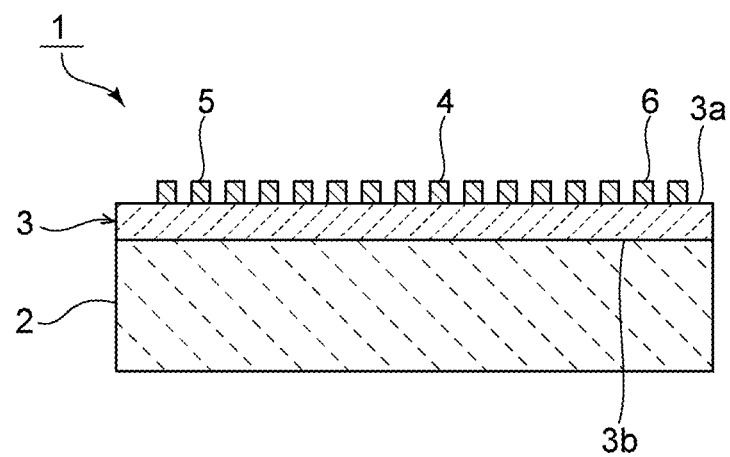
FIG. 1 is a front cross-sectional view of an acoustic wave device according to a first preferred embodiment of the present invention.
Figure 2:
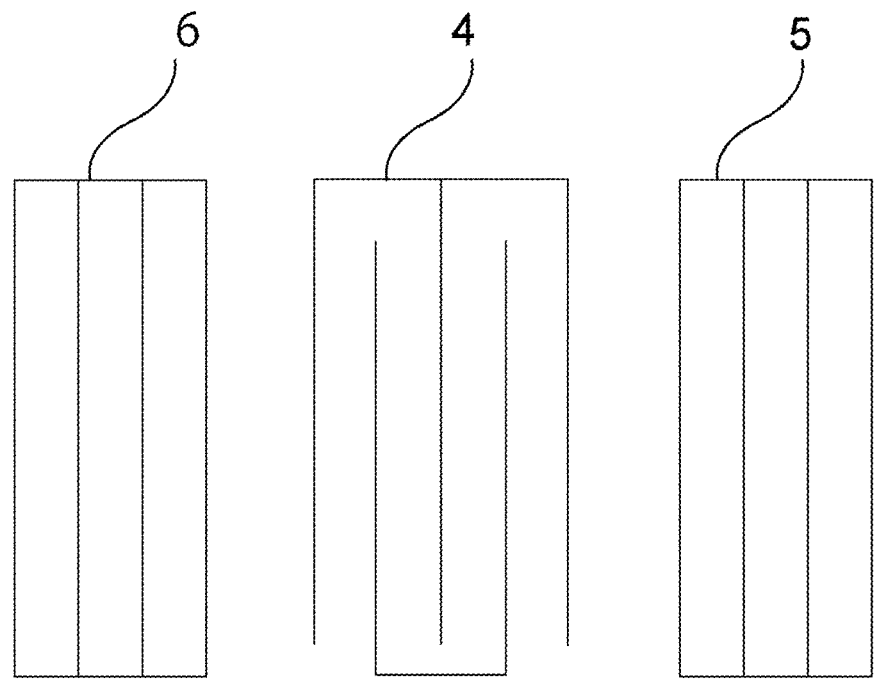
FIG. 2 is a schematic plan view illustrating an electrode structure of the acoustic wave device according to the first preferred embodiment of the present invention.

FIG. 1 is a front cross-sectional view of an acoustic wave device according to a first preferred embodiment of the present invention, and FIG. 2 is a schematic plan view illustrating an electrode structure of the acoustic wave device according to the first preferred embodiment.

An acoustic wave device 1 includes a material layer 2 preferably made of, for example, a silicon (Si) single crystal. A piezoelectric body 3 preferably made of, for example, a lithium tantalate (LiTaO$_3$) single crystal is laminated on the material layer 2. Therefore, in the present preferred embodiment, the material layer 2 also defines and functions as a support substrate supporting the piezoelectric body 3.

The piezoelectric body 3 includes first and second principal surfaces 3a and 3b opposing each other. The piezoelectric body 3 is directly laminated on the material layer 2 so that the second principal surface 3b is on the material layer 2 side. An IDT electrode 4 and reflectors 5, 6 are provided on the first principal surface 3a. With the above elements, an acoustic wave resonator is provided in the acoustic wave device 1. The acoustic wave device 1 is preferably a surface acoustic wave device that utilizes a surface acoustic wave propagating in the piezoelectric body 3. However, in the present invention, the acoustic wave device is not limited to the device utilizing the surface acoustic wave.

The IDT electrode 4 and the reflectors 5, 6 are preferably made of, for example, Al. However, the IDT electrode 4 and the reflectors 5, 6 may be made of other metals. The IDT electrode 4 and the reflectors 5, 6 may include a plurality of metal films that are laminated.

The acoustic wave device 1 includes the material layer which has Euler angles ($\varphi_1$, $\theta_1$, $\psi_1$) and whose elastic constant at the Euler angles ($\varphi_1$, $\theta_1$, $\psi_1$) is represented by Expression 1 below, the piezoelectric body which includes the first and second principal surfaces opposing each other, is laminated directly or indirectly on the material layer so that the second principal surface is on the material layer side and has Euler angles ($\varphi_2$, $\theta_2$, $\psi_2$), and whose elastic constant at the Euler angles ($\varphi_2$, $\theta_2$, $\psi_2$) is represented by Expression 1 below, and the IDT electrode which is disposed on at least one of the first principal surface and the second principal surface of the piezoelectric body. Further, a product of $C_{56}$ (=$C_{65}$) of the piezoelectric body 3 and $C_{56}$ (=$C_{65}$) of the material layer 2 has a positive value (the value of $C_{56}$ and $C_{65}$ ($C_{56}$=$C_{65}$) in the piezoelectric body 3 and the values of $C_{56}$ and $C_{65}$ ($C_{56}$=$C_{65}$) in the material layer 2 have the same sign of positive or negative), and an absolute value of $C_{56}$ (=$C_{65}$) of the material layer is greater than an absolute value of $C_{56}$ (=$C_{65}$) of the piezoelectric body 3. Note that the values of $C_{56}$ and $C_{65}$ are not equal to zero. This makes it possible to reduce or prevent the response of the high-order mode that appears on a higher frequency side relative to the main mode. This will be described in more detail below.

Figure 3:
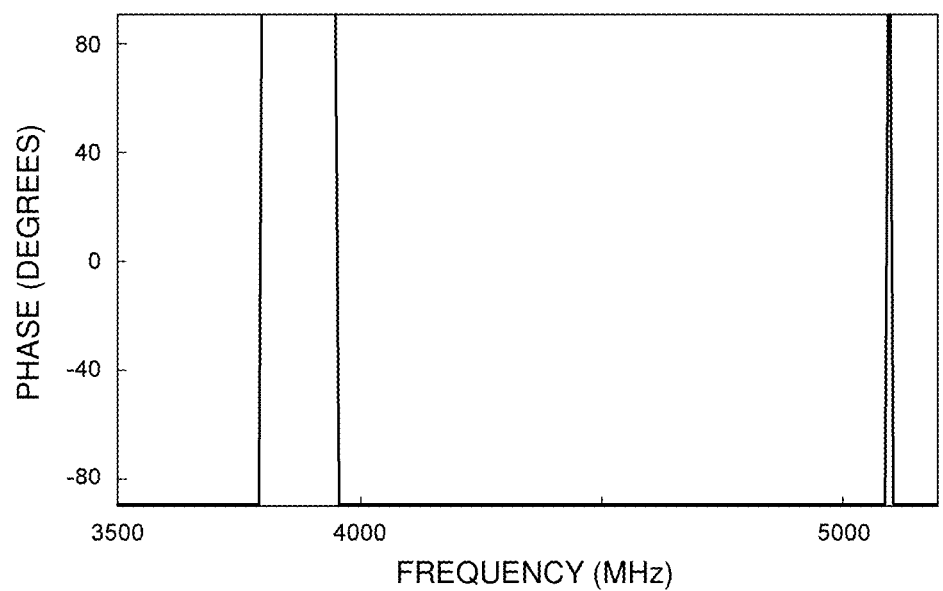
FIG. 3 is a graph showing a phase characteristic of an acoustic wave device in which an IDT electrode including a silicon oxide film, a lithium tantalate film, and Al is laminated on a material layer made of silicon utilizing a silicon (100) plane.

FIG. 3 is a graph showing a phase characteristic of an acoustic wave device using a silicon (100) plane (=a plane of Euler angles (−90°, −90°, ψ)), which has generally been used. In this acoustic wave device, an IDT electrode including a silicon oxide film, a lithium tantalate film, and Al is laminated on a silicon single crystal. The wave length determined by the electrode finger pitch of the IDT electrode is defined as λ, and λ was set to about 1.0 μm. The film thickness of the silicon oxide film was about 0.35λ, the film thickness of the lithium tantalate film was about 0.3λ, a cut-angle was about 50°, and Euler angles were (0°, 140°, 0°). The IDT electrode had a film thickness of about 0.08λ. In the case of Euler angles (−90°, −90°, 0°), a relationship of $C_{56}$=$C_{65}$=0 [Pa] is satisfied.

As is apparent from FIG. 3, in the acoustic wave device using a silicon (100) plane, which has generally been used, a response of the main mode appears near about 3900 MHz. By having the above-described laminated structure, the characteristics of the main mode are favorable. However, a response of a high-order mode appears on a higher frequency side relative to the main mode, that is, at around 5100 MHz. In this high-order mode response, a phase maximum value is about 90° and the response of the high-order mode is significantly strong. Therefore, in a case where an acoustic wave filter or the like is configured by using this acoustic wave device, there is a risk that the filter characteristics of another band pass filter will be deteriorated.

In recent years, a multiplexer for carrier aggregation (CA) has been widely used in mobile communication apparatus such as smartphones, for example. In the multiplexer, a plurality of band pass filters are commonly connected to an antenna terminal. When one band pass filter includes the above-described acoustic wave device, in the case where the pass band of another band pass filter is at a frequency position including 5100 MHz, there is a risk that the filter characteristics of the other band pass filter will be deteriorated. Because of this, the reduction or prevention of the response of the high-order mode is strongly required.

The inventors of preferred embodiments of the present invention have discovered that, as a result of research on the reduction or prevention of the high-order mode, the high-order mode is able to be reduce or prevented by configuring the acoustic wave device in the following manner. That is, the acoustic wave device includes a material layer which has Euler angles ($\varphi_1$, $\theta_1$, $\psi_1$) and whose elastic constant at the Euler angles ($\varphi_1$, $\theta_1$, $\psi_1$) is represented by Expression 1 below, a piezoelectric body which includes first and second principal surfaces opposing each other, is laminated directly or indirectly on the material layer so that the second principal surface is on the material layer side and has Euler angles ($\varphi_2$, $\theta_2$, $\psi_2$), and whose elastic constant at the Euler angles ($\varphi_2$, $\theta_2$, $\psi_2$) is represented by Expression 1 below, and an IDT electrode which is disposed on at least one of the first principal surface and the second principal surface of the piezoelectric body. Further, in the acoustic wave device, a product of $C_{56}$ (=$C_{65}$) of the piezoelectric body 3 and $C_{56}$ (=$C_{65}$) of the material layer 2 has a positive value (the value of $C_{56}$ and $C_{65}$ ($C_{56}$=$C_{65}$) in the piezoelectric body 3 and the value of $C_{56}$ and $C_{65}$ ($C_{56}$=$C_{65}$) in the material layer 2 has the same sign of positive or negative), and an absolute value of $C_{56}$ (=$C_{65}$) of the material layer is greater than an absolute value of $C_{56}$ (=$C_{65}$) of the piezoelectric body 3. Thus, preferred embodiments of the present invention have been developed.

Here, the elastic constants $C_{11}$ to $C_{66}$ are provided in the form of a determinant represented by the following Expression 1.

Formula 3

$$\begin{pmatrix} C_{11} & C_{12} & C_{13} & C_{14} & C_{15} & C_{16} \\ C_{21} & C_{22} & C_{23} & C_{24} & C_{25} & C_{26} \\ C_{31} & C_{32} & C_{33} & C_{34} & C_{35} & C_{36} \\ C_{41} & C_{42} & C_{43} & C_{44} & C_{45} & C_{46} \\ C_{51} & C_{52} & C_{53} & C_{54} & C_{55} & C_{56} \\ C_{61} & C_{62} & C_{63} & C_{64} & C_{65} & C_{66} \end{pmatrix} \quad \text{Expression 1}$$

Figure 5:
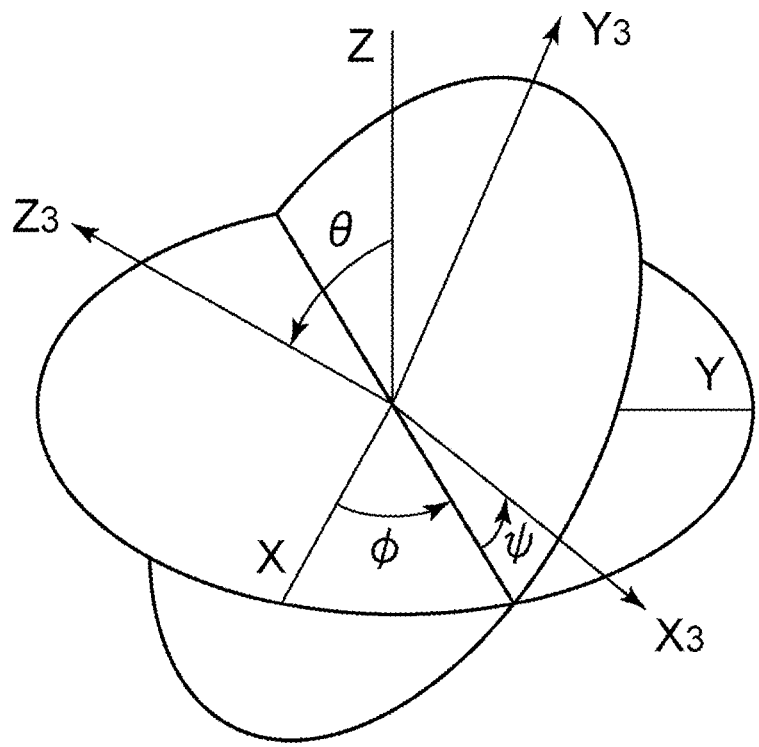
FIG. 5 is a schematic diagram illustrating a relationship between a coordinate system (X, Y, Z) and Euler angles (φ, θ, ψ)

FIG. 5 is a schematic diagram illustrating a relationship between a coordinate system (X, Y, Z) and Euler angles ($\varphi$, $\theta$, $\psi$).

In the present specification, as the Euler angles ($\varphi$, $\theta$, $\psi$), right-handed Euler angles described in the document "Acoustic Wave Device Technology Handbook" (150th Committee of Acoustic Wave Device Technology of Japan Society for the Promotion of Science, first edition, first printing, published on Nov. 30, 2001, 549 pages) were used. A case of silicon will be exemplified and explained, in which the crystal axes of the silicon are defined as an X-axis, a Y-axis and a Z-axis, as illustrated in FIG. 5. Euler angles ($\varphi$, $\theta$, $\psi$) are described as follows. The rotational direction of a right-hand screw is taken as a positive direction; (1) the (X, Y, Z) are rotated about the Z-axis by "$\varphi$" so as to be ($X_1$, $Y_1$, $Z_1$), and (2) the ($X_1$, $Y_1$, $Z_1$) are rotated about the $X_1$-axis by "$\theta$" so as to be ($X_2$, $Y_2$, $Z_2$). The plane having the $Z_2$-axis as a normal line is a material layer or a principal surface of a piezoelectric body. Further, (3) the ($X_2$, $Y_2$, $Z_2$) are rotated about the $Z_2$-axis by "$\psi$" so as to be ($X_3$, $Y_3$, $Z_3$). At this time, the above-described rotating operations are represented using the Euler angles as ($\varphi$, $\theta$, $\psi$).

The elastic constant represented by Expression 1 refers to an elastic constant obtained in the following manner: with respect to a documented value of the elastic constant of the material layer or the piezoelectric body, coordinate transformation is performed on the elastic constant by the above rotating operations, and thereafter the elastic constant represented by Expression 1 is obtained. An elastic constant $C_{ab}$ in the above Expression 1 is derived by an equation of $(C_{ab}) = [\alpha]^{-1} [C_{ab}^0] [\beta]$. Here, $\alpha$ and $\beta$ are as follows.

Formula 4

$$\alpha = \begin{pmatrix} l_1^2 & l_2^2 & l_3^2 & 2l_2l_3 & 2l_3l_1 & 2l_1l_2 \\ m_1^2 & m_2^2 & m_3^2 & 2m_2m_3 & 2m_3m_1 & 2m_1m_2 \\ n_1^2 & n_2^2 & n_3^2 & 2n_2n_3 & 2n_3n_1 & 2n_1n_2 \\ m_1n_1 & m_2n_2 & m_3n_3 & m_2n_3+m_3n_2 & m_3n_1+m_1n_3 & m_1n_2+m_2n_1 \\ n_1l_1 & n_2l_2 & n_3l_3 & n_2l_3+n_3l_2 & n_3l_1+n_1l_3 & n_1l_2+n_2l_1 \\ l_1m_1 & l_2m_2 & l_3m_3 & l_2m_3+l_3m_2 & l_3m_1+l_1m_3 & l_1m_2+l_2m_1 \end{pmatrix}$$

$$\beta = \begin{pmatrix} l_1^2 & l_2^2 & l_3^2 & l_2l_3 & l_3l_1 & l_1l_2 \\ m_1^2 & m_2^2 & m_3^2 & m_2m_3 & m_3m_1 & m_1m_2 \\ n_1^2 & n_2^2 & n_3^2 & n_2n_3 & n_3n_1 & n_1n_2 \\ 2m_1n_1 & 2m_2n_2 & 2m_3n_3 & m_2n_3+m_3n_2 & m_3n_1+m_1n_3 & m_1n_2+m_2n_1 \\ 2n_1l_1 & 2n_2l_2 & 2n_3l_3 & n_2l_3+n_3l_2 & n_3l_1+n_1l_3 & n_1l_2+n_2l_1 \\ 2l_1m_1 & 2l_2m_2 & 2l_3m_3 & l_2m_3+l_3m_2 & l_3m_1+l_1m_3 & l_1m_2+l_2m_1 \end{pmatrix}$$

Note that, $l_1$ to $l_3$, $m_1$ to $m_3$, and $n_1$ to $n_3$ in $\alpha$ and $\beta$ are as follows.

$l_1 = \cos \psi \cos \varphi - \cos \theta \sin \varphi \sin \psi$
$l_2 = -\sin \psi \cos \varphi - \cos \theta \sin \varphi \cos \psi$
$l_3 = \sin \theta \sin \varphi$
$m_1 = \cos \psi \sin \varphi + \cos \theta \cos \varphi \sin \psi$
$m_2 = -\sin \psi \sin \varphi + \cos \theta \cos \varphi \cos \psi$
$m_3 = -\sin \theta \cos \varphi$
$n_1 = \sin \psi \sin \theta$
$n_2 = \cos \psi \sin \theta$
$n_3 = \cos \theta$ The elastic constant $C_{ab}$ is an elastic constant obtained in the following manner: with respect to a documented value $C_{ab}^0$ of the elastic constant of the material layer or the piezoelectric body, the coordinate transformation is performed on the elastic constant by the above-described rotating operations, and thereafter the desired elastic constant $C_{ab}$ is obtained. Therefore, even in the case where the same material is used, each component of the elastic constant may have various values and signs depending on the Euler angles.

Figure 9:
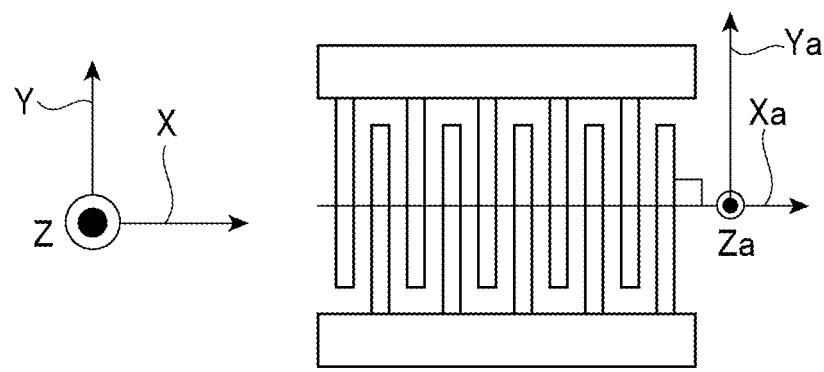
FIG. 9 is a diagram illustrating a relationship between coordinate axes of a material layer and a piezoelectric body when Euler angles of each of the material layer and the piezoelectric body are (0°, 0°, 0°)

FIG. 9 illustrates a relationship between the coordinate axes of a material layer and a piezoelectric body when Euler angles of each of the material layer and the piezoelectric body are (0°, 0°, 0°). The X-axis, Y-axis, and Z-axis of the left drawing in FIG. 9 are crystal axes of the material layer, and the Xa-axis, Ya-axis, and Za-axis in FIG. 9 are crystal axes of the piezoelectric body. When the Euler angles are (0°, 0°, 0°) in both of them, as illustrated in FIG. 9, X and Xa, Y and Ya, and Z and Za are respectively defined to indicate the same directions. When the acoustic wave propagating in the piezoelectric body is an X propagation wave, the Xa direction and the IDT electrode are perpendicular or substantially perpendicular to each other.

Among the elastic constant $C_{ab}$, stress $T_a$, and strain $S_b$, there is a relationship as represented by Expression 3 given below.

Formula 5

$$\begin{pmatrix} T_1 \\ T_2 \\ T_3 \\ T_4 \\ T_5 \\ T_6 \end{pmatrix} = \begin{pmatrix} C_{11} & C_{12} & C_{13} & C_{14} & C_{15} & C_{16} \\ C_{21} & C_{22} & C_{23} & C_{24} & C_{25} & C_{26} \\ C_{31} & C_{32} & C_{33} & C_{34} & C_{35} & C_{36} \\ C_{41} & C_{42} & C_{43} & C_{44} & C_{45} & C_{46} \\ C_{51} & C_{52} & C_{53} & C_{54} & C_{55} & C_{56} \\ C_{61} & C_{62} & C_{63} & C_{64} & C_{65} & C_{66} \end{pmatrix} \begin{pmatrix} S_1 \\ S_2 \\ S_3 \\ S_4 \\ S_5 \\ S_6 \end{pmatrix} \quad \text{Expression 3}$$

That is, the stress $T_a$ is obtained by the product of the elastic constant $C_{ab}$ and the strain $S_b$.

The elastic constant $C_{ab}$ is obtained after performing rotation processing corresponding to each of the three Euler angles with respect to a tensor of the elastic constant of silicon, which is generally known.

By this coordinate transformation method, the elastic constant in each of crystal orientations is able to be derived. However, when the crystal orientation of the single crystal is rotated by the rotating operation, the elastic constant represented by Expression 1 changes.

Hereinafter, the acoustic wave device of the first preferred embodiment and an acoustic wave device of a comparative example will be described.

In the acoustic wave device of the first preferred embodiment, the piezoelectric body 3 having a thickness of about 0.3λ and made of lithium tantalate with a cut-angle of about 66° Y, was laminated on the material layer 2 made of a silicon single crystal. The IDT electrode 4 having a thickness of about 0.08λ and made of Al was provided on the piezoelectric body 3. The wave length determined by the electrode finger pitch of the IDT electrode 4 was set to about 1.0 μm.

The cut-angle of the piezoelectric body 3 made of lithium tantalate is about 66°, and the Euler angles thereof are (0°, 156°, 0°). The elastic constant of the piezoelectric body 3 in this case is shown in Table 1 below. Here, in the case where an absolute value of each of $C_{11}$ to $C_{66}$ is equal to or smaller than about $1.0 \times 10^9$ Pa, such a value is described as 0 Pa because the value is small and not influential. In Table 1, the number of significant digits is two.

TABLE 1

| | | | b | | | |
|---|---|---|---|---|---|---|
| $C_{ab}$ | 1 | 2 | 3 | 4 | 5 | 6 |
| a 1 | 2.3E+11 | 5.8E+10 | 6.7E+10 | −2.1E+10 | 0.0E+00 | 0.0E+00 |
| 2 | 5.8E+10 | 2.3E+11 | 8.1E+10 | −1.1E+10 | 0.0E+00 | 0.0E+00 |
| 3 | 6.7E+10 | 8.1E+10 | 2.8E+11 | −2.9E+08 | 0.0E+00 | 0.0E+00 |
| 4 | −2.1E+10 | −1.1E+10 | −2.9E+08 | 9.6E+10 | 0.0E+00 | 0.0E+00 |
| 5 | 0.0E+00 | 0.0E+00 | 0.0E+00 | 0.0E+00 | 8.8E+10 | −8.4E+09 |
| 6 | 0.0E+00 | 0.0E+00 | 0.0E+00 | 0.0E+00 | −8.4E+09 | 1.0E+11 |

As shown in Table 1, in the piezoelectric body 3 made of lithium tantalate, the elastic constant $C_{56}$ is about $-8.4 \times 10^9$ Pa, which is a negative value.

Note that, as described above, the elastic constants $C_{11}$ to $C_{66}$ of the material layer 2 may be changed by rotating the crystal orientation. In other words, by changing a propagation orientation ψ, φ, and θ of silicon, the values of the elastic constants $C_{11}$ to $C_{66}$ may be changed. Further, even when a material other than silicon is selected, the values of $C_{11}$ to $C_{66}$ may be changed. In other materials, the values vary depending on the orientations.

For example, in the case where the crystal orientations of a silicon single crystal are (−45°, −54.7°, 25°), $C_{11}$ to $C_{66}$ are as shown in Table 2 given below.

TABLE 2

| | | | b | | | |
|---|---|---|---|---|---|---|
| $C_{ab}$ | 1 | 2 | 3 | 4 | 5 | 6 |
| a 1 | 1.9E+11 | 5.4E+10 | 4.5E+10 | −3.5E+09 | −1.3E+10 | 0.0E+00 |
| 2 | 5.4E+10 | 1.9E+11 | 4.5E+10 | 3.5E+09 | 1.3E+10 | 0.0E+00 |
| 3 | 4.5E+10 | 4.5E+10 | 2.0E+11 | 0.0E+00 | 0.0E+00 | 0.0E+00 |
| 4 | −3.5E+09 | 3.5E+09 | 0.0E+00 | 6.0E+10 | 0.0E+00 | 1.3E+10 |
| 5 | −1.3E+10 | 1.3E+10 | 0.0E+00 | 0.0E+00 | 6.0E+10 | −3.5E+09 |
| 6 | 0.0E+00 | 0.0E+00 | 0.0E+00 | 1.3E+10 | −3.5E+09 | 7.0E+10 |

On the other hand, the elastic constants $C_{11}$ to $C_{66}$ in the case where the crystal orientations of a silicon single crystal are (−45°, −54.7°, 0°) are as shown in Table 3 below.

TABLE 3

| | | | b | | | |
|---|---|---|---|---|---|---|
| $C_{ab}$ | 1 | 2 | 3 | 4 | 5 | 6 |
| a 1 | 1.9E+11 | 5.4E+10 | 4.5E+10 | −1.4E+10 | 0.0E+00 | 0.0E+00 |
| 2 | 5.4E+10 | 1.9E+11 | 4.5E+10 | 1.4E+10 | 0.0E+00 | 0.0E+00 |
| 3 | 4.5E+10 | 4.5E+10 | 2.0E+11 | 0.0E+00 | 0.0E+00 | 0.0E+00 |
| 4 | −1.4E+10 | 1.4E+10 | 0.0E+00 | 6.0E+10 | 0.0E+00 | 0.0E+00 |
| 5 | 0.0E+00 | 0.0E+00 | 0.0E+00 | 0.0E+00 | 6.0E+10 | −1.4E+10 |
| 6 | 0.0E+00 | 0.0E+00 | 0.0E+00 | 0.0E+00 | −1.4E+10 | 7.0E+10 |

As is apparent from the comparison between Table 2 and Table 3, it is possible to change the values of the elastic constants $C_{11}$ to $C_{66}$ by changing the propagation orientation ψ of silicon.

As shown in Tables 2 and 3, $C_{56}$ has a negative value in any of the crystal orientations. Therefore, in the case of the crystal orientations shown in Table 2 and Table 3, the elastic constant $C_{56}$ of silicon and the elastic constant $C_{56}$ of the piezoelectric body 3 shown in Table 1 have the same sign of positive or negative. Note that the absolute value of $C_{56}$ in Table 2 is smaller than that of the piezoelectric body, and in the case of Table 3, the absolute value of $C_{56}$ is greater than that of the piezoelectric body.

Figure 4:
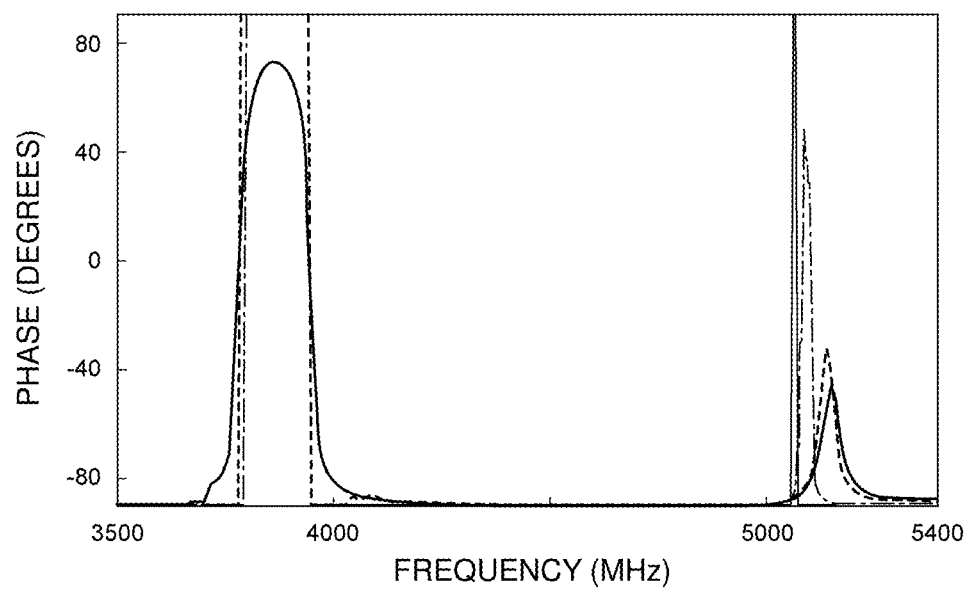
FIG. 4 is a graph showing a phase characteristic of an acoustic wave device in the case where a silicon single crystal with Euler angles (−45°, −54.7°, 0°) is provided as a reference, and an absolute value of an elastic constant $C_{56}$ is changed while keeping the value of the elastic constant $C_{56}$ in a negative side.

In the acoustic wave device 1, an elastic constant of a case in which the crystal orientations of a silicon single crystal were (−45°, −54.7°, 0°) was taken as a reference, and the crystal orientations of the silicon single crystal were changed. By doing so, the value of $C_{56}$ was changed so that the absolute value thereof was increased in the negative side. FIG. 4 shows a phase characteristic of a high-order mode when the value of $C_{56}$ was changed as described above.

In FIG. 4, a thin solid line indicates a phase characteristic when $C_{56}$ is about 0 GPa, a dot-dash line indicates a phase characteristic when $C_{56}$ is about −11.2 GPa, a broken line indicates a phase characteristic when $C_{56}$ is about −28 GPa, and a thick solid line indicates a phase characteristic when $C_{56}$ is about −35 GPa.

As is apparent from FIG. 4, it is understood that a phase maximum value of the high-order mode appearing near 5100 MHz to 5200 MHz becomes smaller as the absolute value of $C_{56}$ becomes larger.

Next, the inventors of preferred embodiments of the present invention changed the elastic constant $C_{56}$ of the silicon single crystal in a wider range to examine a change in the phase maximum value of the high-order mode of the acoustic wave device.

Figure 6:
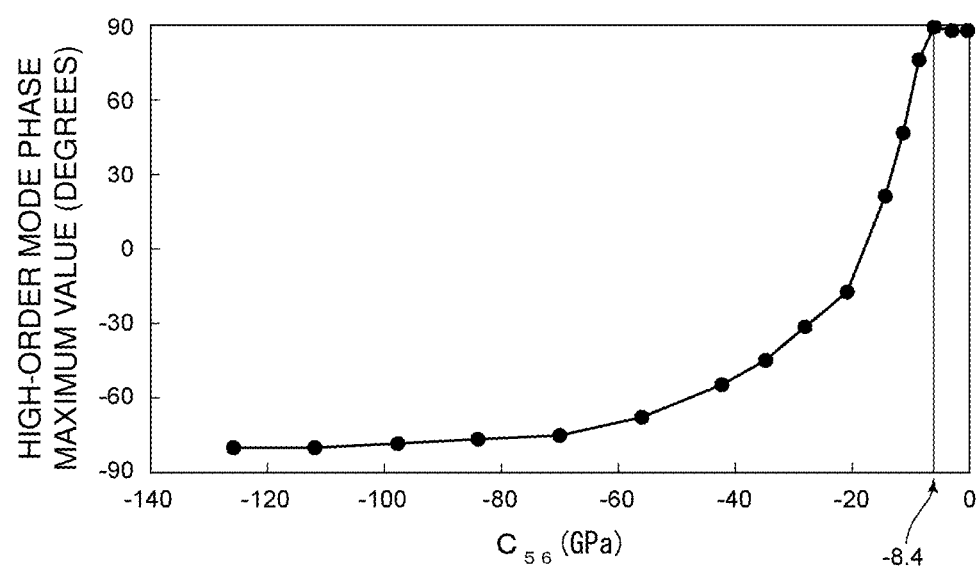
FIG. 6 is a graph showing a relationship between an elastic constant $C_{56}$ and a phase maximum value of a high-order mode.

FIG. 6 is a graph showing a relationship between the elastic constant $C_{56}$ and the phase maximum value of the high-order mode. As is apparent from FIG. 6, as the absolute value of $C_{56}$ becomes larger, the phase maximum value of the high-order mode becomes smaller. However, when the absolute value of the elastic constant $C_{56}$ of the high-order mode is smaller than about 8.4 GPa, the effect of reducing or preventing the response of the high-order mode is not observed. Therefore, it is preferable that the absolute value of the elastic constant $C_{56}$ be equal to or greater than about 8.4 GPa, for example. The limit that this absolute value is equal to or greater than about 8.4 GPa refers to a lower limit value in the case where the piezoelectric body 3 made of lithium tantalate having the aforementioned crystal orientations, and the silicon single crystal are used. In a case where a piezoelectric body having other crystal orientations is used, the above-described lower limit value differs.

Figure 7:
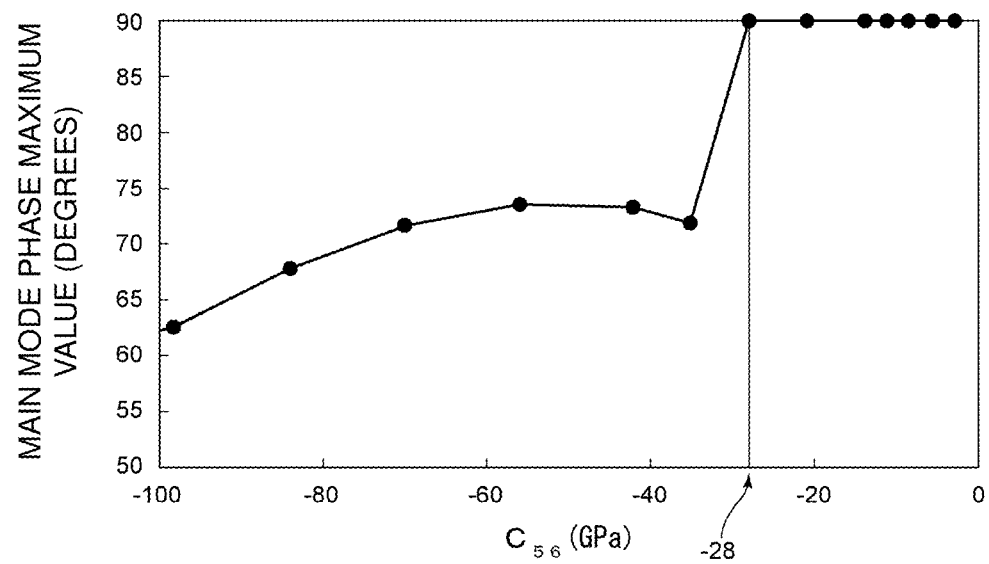
FIG. 7 is a graph showing a relationship between an elastic constant $C_{56}$ and a phase maximum value of the main mode.

On the other hand, FIG. 7 is a graph showing a change in a phase maximum value of the main mode in the case where the elastic constant $C_{56}$ of the silicon single crystal is changed. As is apparent from FIG. 7, when the absolute value of $C_{56}$ is equal to or smaller than about 28 GPa, the phase maximum value of the main mode is about 90°. Therefore, preferred characteristics are able to be maintained. Accordingly, in the present preferred embodiment, it is preferable that the absolute value of $C_{56}$ and $C_{65}$ ($C_{56}=C_{65}$) of the silicon single crystal fall within a range from equal to or greater than about 8.4 GPa to equal to or smaller than about 28 GPa, for example.

As described above, in the acoustic wave device 1, the response of the high-order mode is able to be reduced or prevented, because the value of the elastic constants $C_{56}$ and $C_{65}$ ($C_{56}$=$C_{65}$) in the piezoelectric body 3 and the value of the elastic constants $C_{56}$ and $C_{65}$ ($C_{56}$=$C_{65}$) in the material layer 2 have the same sign of positive or negative, and the absolute value of $C_{56}$ and $C_{65}$ ($C_{56}$=$C_{65}$) of the material layer 2 is larger than the absolute value of $C_{56}$ and $C_{65}$ ($C_{56}$=$C_{65}$) of the piezoelectric body 3. In this case, it is considered that the material layer 2 becomes harder than the piezoelectric body 3 so that the material layer 2 is hardly deformed by the high-order mode when the piezoelectric body 3 is excited. Then, in preferred embodiments of the present invention, such reduction or prevention of the high-order mode is achieved by adjusting the value of $C_{56}$ and $C_{65}$ ($C_{56}$=$C_{65}$) among the elastic constants of the piezoelectric body 3 and the material layer 2.

Accordingly, it is possible to effectively reduce or prevent the response of the high-order mode by designing the electrode structure and other design parameters to obtain preferable characteristics of the main mode and adjusting the above-described elastic constants.

The elastic constants $C_{56}$ and $C_{65}$ ($C_{56}$=$C_{65}$) are adjusted among the elastic constants $C_{11}$ to $C_{66}$ for the following reasons.

As is apparent from the comparison between Table 2 and Table 3, it is understood that the absolute value of $C_{56}$ and $C_{65}$ ($C_{56}$=$C_{65}$) is significantly changed when the crystal orientations of the silicon single crystal are changed. Therefore, by adjusting the elastic constant $C_{56}$ and the elastic constant $C_{65}$ at a symmetrical position relative to the elastic constant $C_{56}$ among the elastic constants $C_{11}$ to $C_{66}$, the phase maximum value of the high-order mode is able to be effectively reduced or prevented as described above.

Figure 8:
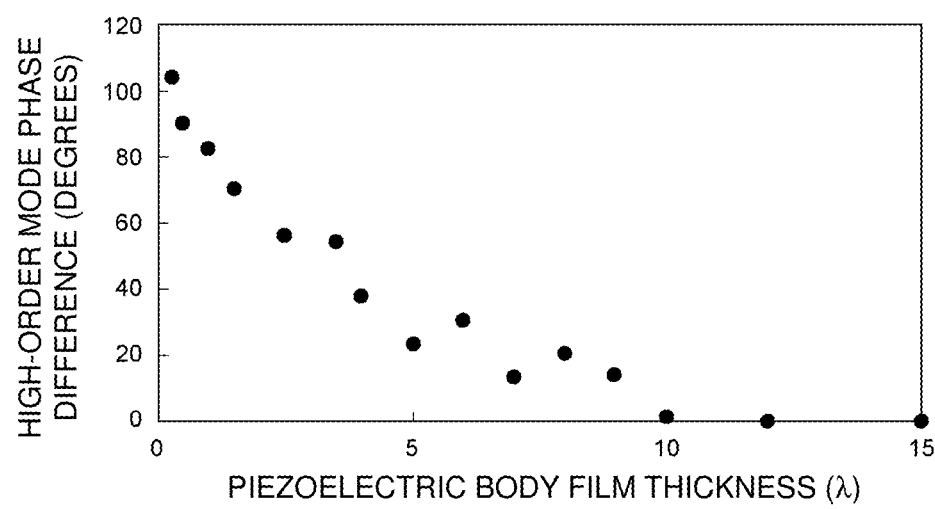
FIG. 8 is a graph showing a relationship between a film thickness of a piezoelectric body and a high-order mode phase difference.

In FIG. 8, the horizontal axis represents a film thickness of the piezoelectric body, that is, a wave-length normalized film thickness of lithium tantalate, and the vertical axis represents a high-order mode phase difference (°). The high-order mode phase difference indicates a difference between the high-order mode phase difference maximum value when the Euler angles of the silicon single crystal are (−45°, −54.7°, 0°) and the high-order mode phase difference maximum value when the Euler angles of the silicon single crystal are (−45°, −54.7°, 180θ) This means that, as the high-order mode phase difference is larger, the response by the high-order mode is reduced or prevented. In other words, as the high-order mode phase difference is larger, the degree of improvement in the high-order mode intensity is larger.

As is apparent from FIG. 8, the thinner the film thickness of the piezoelectric body is, the larger the degree of improvement in the high-order mode intensity is. The reason for this may be as follows: when the piezoelectric body is thin, a larger amount of energy is distributed into the material layer made of the silicon single crystal, so that the effect of reducing or preventing the response of the high-order mode is improved.

Further, according to FIG. 8, it is understood that the effect of reducing or preventing the high-order mode is effective in a region in which the film thickness of the piezoelectric body is equal to or smaller than about 10λ. Therefore, it is preferable for the film thickness of the piezoelectric body to is equal to or smaller than 10λ, for example.

As described above, in the acoustic wave device 1, it is preferable that the absolute value of $C_{56}$ and $C_{65}$ ($C_{56}$=$C_{65}$) of the material layer 2 is equal to or greater than about 8.4 GPa, for example. This is because the piezoelectric body 3 has crystal orientations of (0°, 156°, 0°), and has the elastic constants $C_{11}$ to $C_{66}$ shown in Table 1. Therefore, when the crystal orientations of the piezoelectric single crystal defining the piezoelectric body 3 are different or when another piezoelectric single crystal is used, the preferable lower limit of the absolute value of the elastic constants $C_{56}$ and $C_{65}$ ($C_{56}$=$C_{65}$) is different. That is, it is sufficient that the absolute value of $C_{56}$ and $C_{65}$ ($C_{56}$=$C_{65}$) of the material layer 2 is larger than the absolute value of $C_{56}$ and $C_{65}$ ($C_{56}$=$C_{65}$) of the piezoelectric body 3. This makes it possible to effectively reduce or prevent the response of the high-order mode. Accordingly, it is not necessary in the present invention that the absolute value of $C_{56}$ and $C_{65}$ ($C_{56}$=$C_{65}$) is equal to or greater than about 8.4 GPa.

In the present preferred embodiment, the material layer 2 is preferably made of a silicon single crystal, but the same advantageous effects is able to be achieved by using another single crystal material. Further, not being limited to a single crystal, with the material layer 2 made of a material whose elastic constant is represented by Expression 1, the same or similar advantageous effects are able to be achieved.

However, it is preferable for the material layer 2 to be made of a single crystal, and it is more preferable to be made of a single crystal other than a piezoelectric body. In a case of the piezoelectric body, there is a risk of generating a new high-order mode due to the piezoelectric effect being developed. In contrast, by using a material layer made of a single crystal other than a piezoelectric body, being affected by such additional high-order mode is unlikely to occur.

Although lithium tantalate is preferably used in the present preferred embodiment, the piezoelectric single crystal defining the piezoelectric body is also not limited thereto.

In the present preferred embodiment, the piezoelectric body and the material layer are directly laminated, but a low acoustic velocity film may be disposed between the piezoelectric body and the material layer. In this case, it is possible to increase the degree of energy concentration of the acoustic wave device, and the device characteristics of low loss are able to be obtained.

Preferably, the low acoustic velocity film is made of silicon oxide, for example. In this case, it is possible to improve the temperature characteristics of the device.

Figure 10:
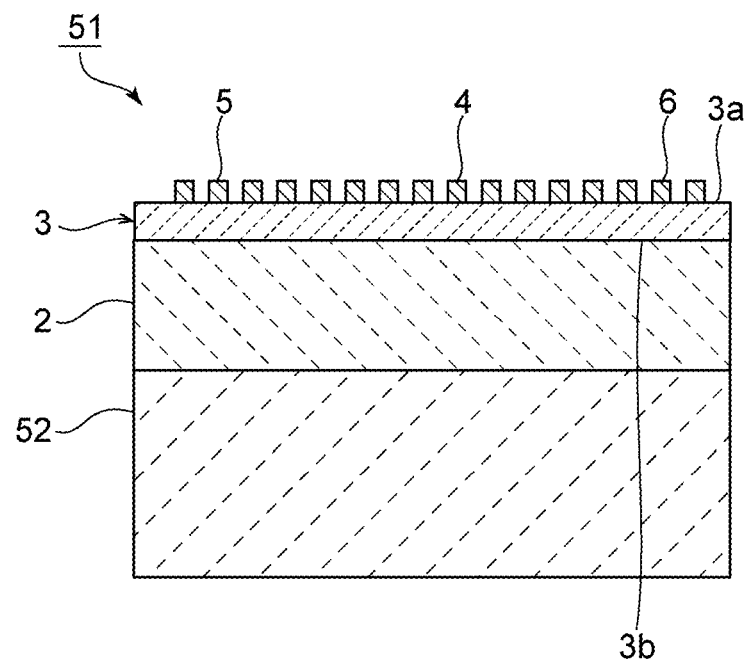
FIG. 10 is a front cross-sectional view of an acoustic wave device according to a modification of the first preferred embodiment of the present invention.

FIG. 10 is a front cross-sectional view of an acoustic wave device according to a modification of the first preferred embodiment. In an acoustic wave device 51 illustrated in FIG. 10, a support substrate 52 is laminated on a surface of the material layer 2 opposed to a surface which is in contact with the piezoelectric body 3. In this manner, the support substrate 52 supporting the material layer 2 may be further provided. The material of the support substrate 52 is not particularly limited, and appropriate insulating ceramics such as alumina and silicon, a metal, and the like, for example, may be used.

Figure 11:
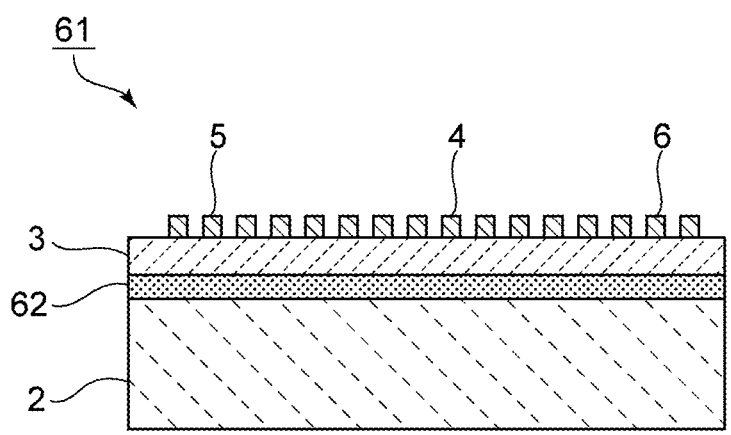
FIG. 11 is a front cross-sectional view of an acoustic wave device according to a second preferred embodiment of the present invention.

FIG. 11 is a front cross-sectional view of an acoustic wave device according to a second preferred embodiment of the present invention. In an acoustic wave device 61, a low acoustic velocity film 62 is laminated between the material layer 2 and the piezoelectric body 3. The low acoustic velocity film 62 is made of a low acoustic velocity material in which a bulk wave propagates at a lower acoustic velocity than an acoustic velocity of an acoustic wave propagating in the piezoelectric body 3. The low acoustic velocity film 62 is preferably made of silicon oxide, for example. Other structures of the acoustic wave device 61 are the same as or similar to those of the acoustic wave device 1.

Figure 12:
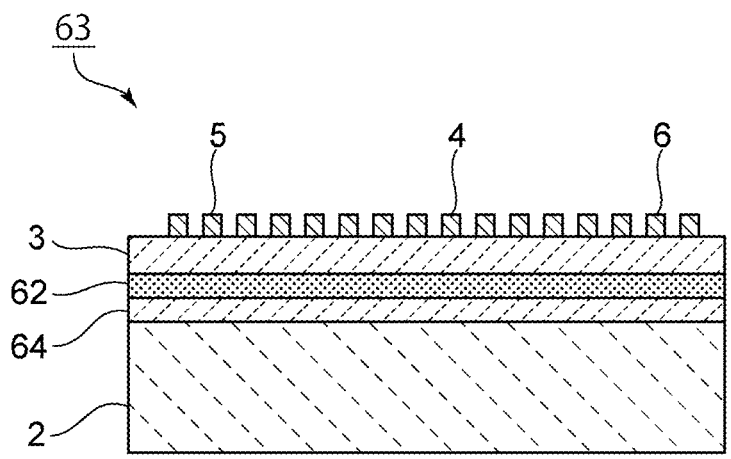
FIG. 12 is a front cross-sectional view of an acoustic wave device according to a third preferred embodiment of the present invention.

FIG. 12 is a front cross-sectional view of an acoustic wave device according to a third preferred embodiment of the present invention. In an acoustic wave device 63, a high acoustic velocity film 64 is disposed between the low acoustic velocity film 62 and the material layer 2. The high acoustic velocity film 64 is made of a high acoustic velocity material in which a bulk wave propagates at a higher acoustic velocity than an acoustic velocity of an acoustic wave propagating in the piezoelectric body 3. The high acoustic velocity film 64 is preferably made of silicon nitride, aluminum oxide, DLC, or the like, for example. Other structures of the acoustic wave device 63 are the same as or similar to those of the acoustic wave device 1.

It is preferable that a film thickness of the piezoelectric body made of a lithium tantalate film is equal to or smaller than about 3.5λ, for example. In this case, the Q value becomes higher than that in the case where the film thickness exceeds about 3.5λ. It is more preferable that, in order to further increase the Q value, the film thickness of the lithium tantalate film is equal to or smaller than about 2.5λ, for example.

When the film thickness of the piezoelectric body is equal to or smaller than about 2.5λ, the absolute value of the temperature coefficient of frequency TCF is able to be made smaller than that in the case where the film thickness exceeds about 2.5λ. It is more preferable that the film thickness is equal to or smaller than about 2λ, for example and in this case, the absolute value of the temperature coefficient of frequency TCF may be set to equal to or smaller than about 10 ppm/° C., for example. In order to reduce the absolute value of the temperature coefficient of frequency TCF, it is further preferable to make the film thickness of the piezoelectric body equal to or smaller than about 1.5λ, for example.

In order to widen an adjustment range of an electromechanical coupling coefficient and a fractional bandwidth, it is preferable for the film thickness of the lithium tantalate film to fall within a range from equal to or greater than about 0.05λ to equal to or smaller than about 0.5λ, for example.

A film made of various high acoustic velocity materials may be laminated, as a high acoustic velocity film, on a surface of the silicon oxide film on the opposite side with respect to the piezoelectric body. In this case, a silicon nitride film, an aluminum oxide film, a DLC film, or the like, for example, may preferably be used as the high acoustic velocity film.

Note that in this case, it has been confirmed that the electromechanical coupling coefficient and the acoustic velocity hardly change even when the material of the high acoustic velocity film and the film thickness of the silicon oxide film are changed. In particular, when the film thickness of the silicon oxide film is equal to or greater than about 0.1λ and equal to or smaller than about 0.5λ, the electromechanical coupling coefficient is hardly changed regardless of the material of the high acoustic velocity film. When the film thickness of the silicon oxide film is equal to or greater than about 0.3λ and equal to or smaller than about 2λ, the acoustic velocity does not change regardless of the material of the high acoustic velocity film. Therefore, it is preferable for the film thickness of the low acoustic velocity film made of silicon oxide to be equal to or smaller than abut 2λ, and more preferable to be equal to or smaller than about 0.5λ, for example.

The acoustic wave device of the preferred embodiment described above may be used as a component of a duplexer or the like of a high frequency front end circuit. An example of such a high frequency front end circuit will be described below.

Figure 13:
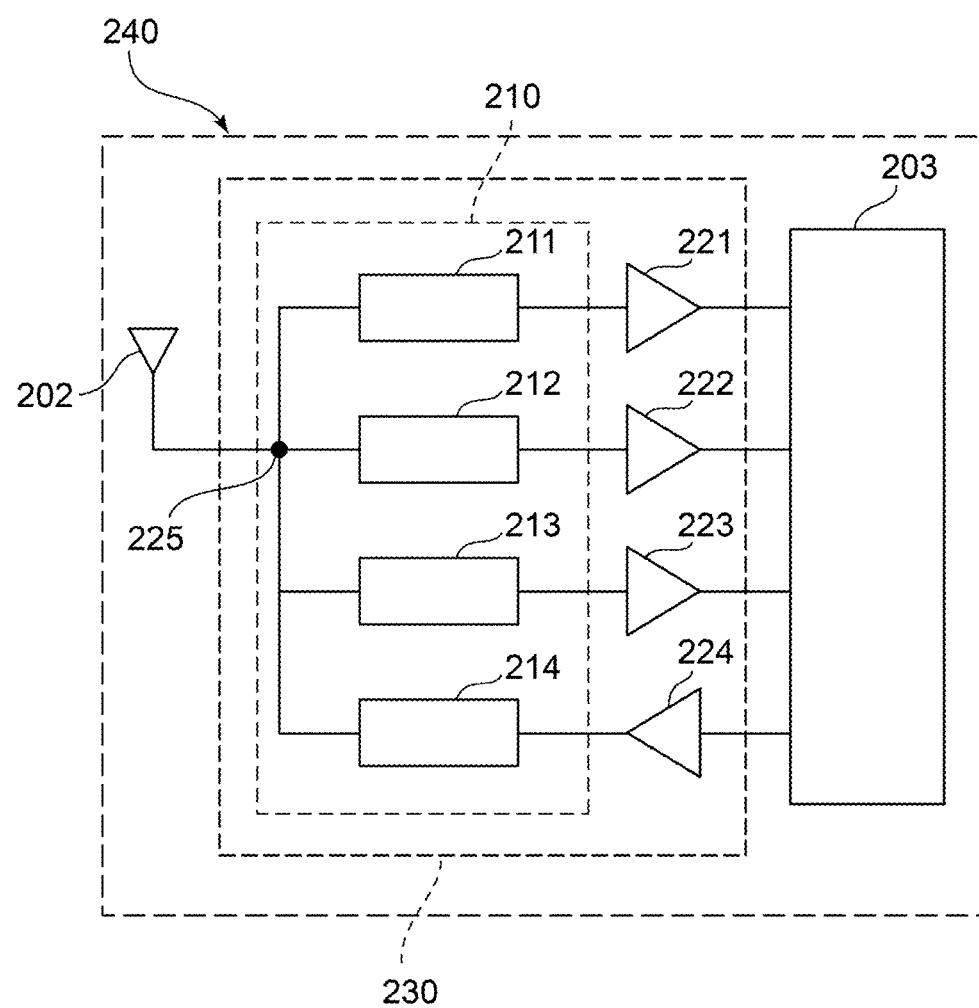
FIG. 13 is a schematic configuration diagram of a communication apparatus including a high frequency front end circuit.

FIG. 13 is a schematic configuration diagram of a communication apparatus including a high frequency front end circuit. A communication apparatus 240 includes an antenna 202, a high frequency front end circuit 230, and an RF signal processing circuit 203. The high frequency front end circuit 230 is a circuit section connected to the antenna 202. The high frequency front end circuit 230 includes a multiplexer 210 and amplifiers 221 to 224. The multiplexer 210 includes first to fourth filters 211 to 214. The acoustic wave device of preferred embodiments of the present invention described above may be used for the first to fourth filters 211 to 214. The multiplexer 210 includes an antenna common terminal 225 connected to the antenna 202. One end of each of the first to third filters 211 to 213 that are reception filters and one end of the fourth filter 214 that is a transmission filter are commonly connected to the antenna common terminal 225. Output ends of the first to third filters 211 to 213 are connected to the amplifiers 221 to 223, respectively. The amplifier 224 is connected to an input end of the fourth filter 214.

Output ends of the amplifiers 221 to 223 are connected to the RF signal processing circuit 203. An input end of the amplifier 224 is connected to the RF signal processing circuit 203.

Thus far, the preferred embodiments have been described with respect to the acoustic wave devices, the high frequency front end circuit, and the communication apparatus according to the preferred embodiments of the present invention. However, other preferred embodiments provided by combining arbitrary elements of the above-described preferred embodiments, modifications achieved by making variations conceived by those skilled in the art to the above-described preferred embodiments without departing from the spirit and scope of the present invention, various kinds of apparatus incorporating the high frequency front end circuit and the communication apparatus according to preferred embodiments of the present invention, and the like are also included in the present invention.

For example, in the above description, a filter is preferably described as a device including an acoustic wave resonator. However, preferred embodiments of the present invention may also be applied, for example, to multiplexers such as a triplexer in which an antenna terminal for three filters is shared and a hexaplexer in which an antenna terminal for six filters is shared.

Furthermore, the multiplexer is not limited to a configuration including both a transmission filter and a reception filter, and may be configured to include only a transmission filter or only a reception filter.

The acoustic wave devices of preferred embodiments of the present invention may be widely used in communication apparatuses such as mobile phones, for example, as a filter, a multiplexer applicable to a multi-band system, a front end circuit, and a communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a material layer with Euler angles ($\varphi_1$, $\theta_1$, $\psi_1$) and an elastic constant at the Euler angles ($\varphi_1$, $\theta_1$, $\psi_1$) that is represented by $$\begin{pmatrix} C_{11} & C_{12} & C_{13} & C_{14} & C_{15} & C_{16} \\ C_{21} & C_{22} & C_{23} & C_{24} & C_{25} & C_{26} \\ C_{31} & C_{32} & C_{33} & C_{34} & C_{35} & C_{36} \\ C_{41} & C_{42} & C_{43} & C_{44} & C_{45} & C_{46} \\ C_{51} & C_{52} & C_{53} & C_{54} & C_{55} & C_{56} \\ C_{61} & C_{62} & C_{63} & C_{64} & C_{65} & C_{66} \end{pmatrix} \quad \text{Expression 1}$$

a piezoelectric body that includes first and second principal surfaces opposing each other, is laminated directly or indirectly on the material layer so that the second principal surface is on a material layer side and has Euler angles ($\varphi_2$, $\theta_2$, $\psi_2$), and has an elastic constant at the Euler angles ($\varphi_2$, $\theta_2$, $\psi_2$) that is represented by the Expression 1; and
an IDT electrode disposed on at least one of the first principal surface and the second principal surface of the piezoelectric body, and in which a wave length determined by an electrode finger pitch is $\lambda$; wherein
a product of $C_{56}$ of the piezoelectric body and $C_{56}$ of the material layer has a positive value; and
an absolute value of $C_{56}$ of the material layer is greater than an absolute value of $C_{56}$ of the piezoelectric body.

2. The acoustic wave device according to claim 1, wherein an elastic constant $C_{ab}$ in the Expression 1 is derived by an equation of $(C_{ab}) = [\alpha]^{-1} [C_{ab}^0] [\beta]$, and $\alpha$ and $\beta$ are:

$$\alpha = \begin{pmatrix} l_1^2 & l_2^2 & l_3^2 & 2l_2l_3 & 2l_3l_1 & 2l_1l_2 \\ m_1^2 & m_2^2 & m_3^2 & 2m_2m_3 & 2m_3m_1 & 2m_1m_2 \\ n_1^2 & n_2^2 & n_3^2 & 2n_2n_3 & 2n_3n_1 & 2n_1n_2 \\ m_1n_1 & m_2n_2 & m_3n_3 & m_2n_3+m_3n_2 & m_3n_1+m_1n_3 & m_1n_2+m_2n_1 \\ n_1l_1 & n_2l_2 & n_3l_3 & n_2l_3+n_3l_2 & n_3l_1+n_1l_3 & n_1l_2+n_2l_1 \\ l_1m_1 & l_2m_2 & l_3m_3 & l_2m_3+l_3m_2 & l_3m_1+l_1m_3 & l_1m_2+l_2m_1 \end{pmatrix}$$

$$\beta = \begin{pmatrix} l_1^2 & l_2^2 & l_3^2 & l_2l_3 & l_3l_1 & l_1l_2 \\ m_1^2 & m_2^2 & m_3^2 & m_2m_3 & m_3m_1 & m_1m_2 \\ n_1^2 & n_2^2 & n_3^2 & n_2n_3 & n_3n_1 & n_1n_2 \\ 2m_1n_1 & 2m_2n_2 & 2m_3n_3 & m_2n_3+m_3n_2 & m_3n_1+m_1n_3 & m_1n_2+m_2n_1 \\ 2n_1l_1 & 2n_2l_2 & 2n_3l_3 & n_2l_3+n_3l_2 & n_3l_1+n_1l_3 & n_1l_2+n_2l_1 \\ 2l_1m_1 & 2l_2m_2 & 2l_3m_3 & l_2m_3+l_3m_2 & l_3m_1+l_1m_3 & l_1m_2+l_2m_1 \end{pmatrix};$$

where $l_1$ to $l_3$, $m_1$ to $m_3$, and $n_1$ to $n_3$ in $\alpha$ and $\beta$ are:
$l_1 = \cos\psi \cos\varphi - \cos\theta \sin\varphi \sin\psi$
$l_2 = -\sin\psi \cos\varphi - \cos\theta \sin\varphi \cos\psi$
$l_3 = \sin\theta \sin\varphi$
$m_1 = \cos\psi \sin\varphi + \cos\theta \cos\varphi \sin\psi$
$m_2 = -\sin\psi \sin\varphi + \cos\theta \cos\varphi \cos\psi$
$m_3 = -\sin\theta \cos\varphi$
$n_1 = \sin\psi \sin\theta$
$n_2 = \cos\psi \sin\theta$
$n_3 = \cos\theta$.

3. The acoustic wave device according to claim 1, wherein at least a portion of a high-order mode excited by the IDT electrode propagates through both of the material layer and the piezoelectric body.

4. The acoustic wave device according to claim 1, wherein the material layer is made of a high acoustic velocity material in which a bulk wave propagates at a higher acoustic velocity than an acoustic velocity of an acoustic wave propagating in the piezoelectric body.

5. The acoustic wave device according to claim 1, wherein the piezoelectric body has a thickness of equal to or smaller than about $10\lambda$.

6. The acoustic wave device according to claim 1, wherein an absolute value of $C_{56}$ of the material layer is equal to or greater than about 8.4 GPa.

7. The acoustic wave device according to claim 1, wherein the absolute value of $C_{56}$ of the material layer is equal to or smaller than about 28 GPa.

8. The acoustic wave device according to claim 1, wherein the material layer is made of a single crystal.

9. The acoustic wave device according to claim 8, wherein the single crystal of the material layer is made of a single crystal other than a piezoelectric body.

10. The acoustic wave device according to claim 1, wherein the piezoelectric body has a thickness of equal to or smaller than about $3.5\lambda$.

11. The acoustic wave device according to claim 1, wherein the single crystal of the material layer is made of silicon.

12. The acoustic wave device according to claim 1, wherein the piezoelectric body is made of lithium tantalate.

13. The acoustic wave device according to claim 1, wherein the material layer is a support substrate.

14. The acoustic wave device according to claim 13, wherein the support substrate is made of a high acoustic velocity material in which a bulk wave propagates at a higher acoustic velocity than the acoustic velocity of the acoustic wave propagating in the piezoelectric body.

15. The acoustic wave device according to claim 1, further comprising: a support substrate laminated on a principal surface of the material layer opposite to a principal surface of the material layer on which the piezoelectric body is laminated.

16. The acoustic wave device according to claim 1, further comprising a low acoustic velocity film which is disposed between the material layer and the piezoelectric body, and in which a bulk wave propagates at a lower acoustic velocity than the acoustic velocity of the acoustic wave propagating in the piezoelectric body.

17. The acoustic wave device according to claim 16, wherein the low acoustic velocity film is a silicon oxide film.

18. The acoustic wave device according to claim 17, wherein the low acoustic velocity film has a thickness of equal to or smaller than about $2\lambda$.

19. The acoustic wave device according to claim 16, further comprising a high acoustic velocity film which is laminated between the low acoustic velocity film and the material layer, and in which a bulk wave propagates at a higher acoustic velocity than the acoustic velocity of the acoustic wave propagating in the piezoelectric body.

* * * * *